(12) United States Patent
Takeda et al.

(10) Patent No.: US 9,887,140 B2
(45) Date of Patent: Feb. 6, 2018

(54) WAFER PROCESSING METHOD

(71) Applicant: DISCO CORPORATION, Tokyo (JP)

(72) Inventors: Noboru Takeda, Tokyo (JP); Takumi Shotokuji, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/483,120

(22) Filed: Apr. 10, 2017

(65) Prior Publication Data

US 2017/0301592 A1    Oct. 19, 2017

(30) Foreign Application Priority Data

Apr. 13, 2016 (JP) .................. 2016-080348

(51) Int. Cl.

| | |
|---|---|
| *H01L 21/00* | (2006.01) |
| *H01L 21/66* | (2006.01) |
| *H01L 41/187* | (2006.01) |
| *H01L 41/338* | (2013.01) |
| *H03H 3/08* | (2006.01) |
| *H03H 9/02* | (2006.01) |

(52) U.S. Cl.
CPC .......... *H01L 22/20* (2013.01); *H01L 41/1873* (2013.01); *H01L 41/338* (2013.01); *H03H 3/08* (2013.01); *H03H 9/02535* (2013.01)

(58) Field of Classification Search
CPC ... H01L 22/20; H01L 41/1873; H01L 41/338; H03H 3/08; G01N 21/211; G01N 21/47; G01N 21/55; G01N 21/636; G01N 21/64; G01N 21/9501; G01N 21/956; G03F 7/70616; G03F 7/70625; G03F 7/70633; G03F 7/7065; G03F 7/07
USPC ........................................ 438/5, 113
See application file for complete search history.

(56) References Cited

U.S. PATENT DOCUMENTS

| | | | |
|---|---|---|---|
| 2010/0267219 A1* | 10/2010 | Kajiyama | B23K 26/0057 438/462 |
| 2015/0034617 A1* | 2/2015 | Sawabe | B23K 26/0057 219/121.73 |

FOREIGN PATENT DOCUMENTS

| | | |
|---|---|---|
| JP | 10-305420 | 11/1998 |
| JP | 2002-192370 | 7/2002 |
| JP | 2014-221483 | 11/2014 |

* cited by examiner

*Primary Examiner* — Brook Kebede
(74) *Attorney, Agent, or Firm* — Greer Burns & Crain, Ltd.

(57) ABSTRACT

There is provided a wafer processing method for dividing a wafer having a plurality of devices formed in regions partitioned by a plurality of crossing division lines on a front surface of a substrate having a birefringent crystal structure, into individual device chips. The wafer processing method includes a detection step of detecting the division line formed on the front surface of the wafer by an imaging unit from the back side of the wafer. In the detection step, a polarizer disposed on an optical axis connecting an imaging element and an image forming lens provided in the imaging unit intercepts extraordinary light appearing due to birefringence in the substrate and guides ordinary light to the imaging element.

4 Claims, 6 Drawing Sheets

WAFER PROCESSING METHOD

BACKGROUND OF THE INVENTION

Field of the Invention

The present invention relates to a wafer processing method for detecting division lines from the back side of a wafer and dividing the wafer into individual device chips.

Description of the Related Art

A wafer having a plurality of devices such as integrated circuits (ICs) and large scale integration (LSI) circuits formed on a front surface of a substrate in regions partitioned by division lines is divided by a dicing apparatus into individual device chips, which are utilized for electronic apparatuses such as mobile phones and personal computers.

In addition, a plurality of surface acoustic wave (SAW) devices are formed in regions partitioned by a plurality of crossing division lines on a front surface of a substrate formed of, for example, lithium niobate ($LiNbO_3$) or lithium tantalate ($LiTaO_3$). In this case, the substrate is difficult to process by a dicing apparatus, and, therefore, division starting points are formed in the substrate by a laser processing apparatus, whereby division into individual SAW devices is performed.

As exemplary types of the laser processing method for forming the division starting points, there have been known a type in which a laser beam of such a wavelength as to be absorbed in a workpiece is applied to perform ablation processing (see, for example, Japanese Patent Laid-open No. 1998-305420), a type in which a laser beam of such a wavelength as to be transmitted through a workpiece is applied while positioning the focal point of the laser beam inside the workpiece to thereby form modified layers in the workpiece (see, for example, Japanese Patent No. 3408805), and a type in which a laser beam of such a wavelength as to be transmitted through a workpiece is applied while positioning the focal point of the laser beam in the vicinity of the surface opposite to the laser applied surface of the workpiece, to thereby form so-called shield tunnels along division lines, wherein each of the shield tunnels is composed of a minute hole extending from the front surface to the back surface of the workpiece and an amorphous phase surrounding the minute hole (see, for example, Japanese Patent Laid-open No. 2014-221483). However, the type in which ablation processing is conducted has a problem in that debris is scattered on the surface of the wafer, to lower the device quality. Therefore, the type of forming the modified layers wherein scattering of debris is substantially absent and the type of forming the shield tunnels have often been adopted.

SUMMARY OF THE INVENTION

In the processing method of the type of forming the modified layers and of the type of forming the shield tunnels, if it is attempted to apply a laser beam from the front side of the wafer, there may arise a problem that the laser beam is blocked by the devices formed on the front side and desired processing cannot be achieved, or a problem that part of the laser beam is applied to the devices to damage the devices. For this reason, the laser beam is applied from the back side of the wafer where the devices are not formed. In the case where the laser beam is applied from the back side of the wafer to perform processing, it is necessary to detect the division lines formed on the front side from the back side and to accurately perform alignment between the division line and a laser beam applying position.

However, when the division line formed on the front side of the wafer is imaged by imaging means located on the back side in the manner of detecting (seeing) through the substrate, a problem would arise depending on the material under detection. Specifically, birefringence due to the crystal structure of the material constituting the substrate may cause a real image appearing as ordinary light and a virtual image appearing as extraordinary light to be imaged, thereby making it difficult to accurately detect the division line.

Accordingly, it is an object of the present invention to provide a wafer processing method by which division lines on the front side of a wafer can be accurately detected from the back side of the wafer and the wafer can be divided into individual device chips.

In accordance with an aspect of the present invention, there is provided a wafer processing method for dividing a wafer having a plurality of devices formed in regions partitioned by a plurality of crossing division lines on a front surface of a substrate having a birefringent crystal structure, into individual device chips, the wafer processing method including: a detection step of detecting the division line formed on the front surface of the wafer by imaging means from a back side of the wafer; a division starting point forming step of applying a laser beam from the back side corresponding to the detected division line to form division starting points; and a division step of applying an external force to the wafer to divide the wafer into the individual device chips, wherein, in the detection step, a polarizer disposed on an optical axis connecting an imaging element and an image forming lens provided in the imaging means intercepts extraordinary light appearing due to birefringence in the substrate and guides ordinary light to the imaging element.

Preferably, the polarizer includes a polarizing plate or a polarization beam splitter, the substrate is formed of lithium niobate ($LiNbO_3$), and the devices are SAW devices. In addition, it is preferable that linearly polarized light having a plane of polarization orthogonal to an orientation flat indicative of a crystal orientation formed on the wafer is the ordinary light.

According to the wafer processing method of the present invention, in the detection step of detecting the division line formed on the front surface of the wafer from the back side of the wafer by the imaging means, the polarizer disposed on the optical axis connecting the imaging element and the image forming lens provided in the imaging means intercepts the extraordinary light appearing through birefringence in the substrate and guides the ordinary light to the imaging element. Therefore, only the ordinary light can be guided to the imaging element in the detection step, and the division line formed on the front side can be accurately detected based on the real image obtained thereby.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
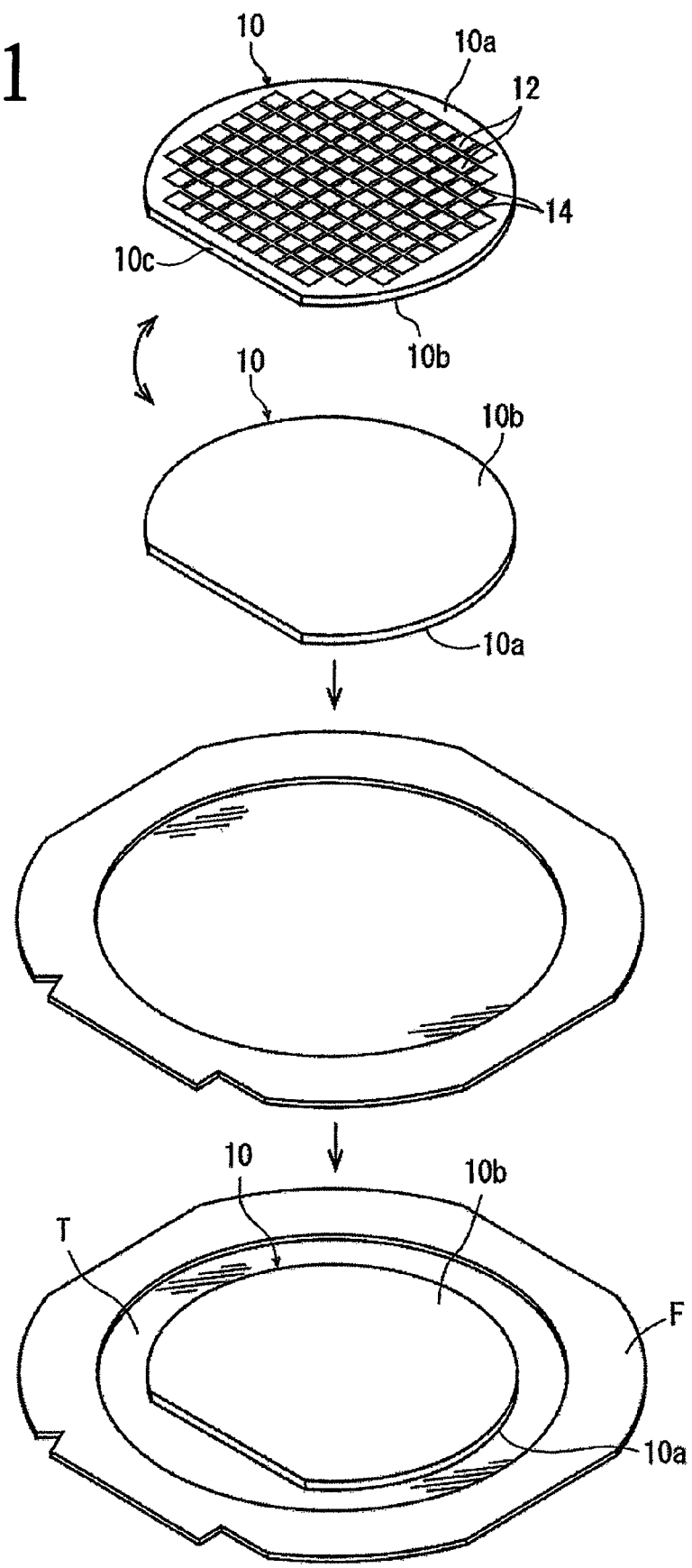
FIG. 1 illustrates a wafer to be processed by a processing method of the present invention.

A wafer processing method configured based on the present invention will now be described in detail below, referring to the attached drawings. FIG. 1 shows a wafer 10 as a workpiece including a lithium niobate ($LiNbO_3$) substrate, a plurality of regions are partitioned on the side of a front surface 10a of the wafer 10 by a plurality of crossing division lines 14, and SAW devices 12 are formed in the thus partitioned regions. In addition, at a side surface of the wafer 10, there is formed an orientation flat 10c indicative of a direction along the inclination direction of the optical axis, or crystal orientation, of lithium niobate constituting the substrate.

The SAW devices 12 are formed in the regions partitioned by the division lines 14 of a width of approximately 30 to 50 μm formed on the side of the front surface 10a of the wafer 10 serving as a workpiece in this embodiment. In order to apply a laser beam from the side of a back surface 10b of the wafer 10 for forming division starting points inside the wafer 10, as shown in FIG. 1, the wafer 10 is positioned to an opening portion of an annular frame F with the back surface 10b of the wafer 10 on the upper side, the front surface 10a side is adhered to a pressure sensitive adhesive tape T, and a peripheral portion of the pressure sensitive adhesive tape T is mounted to the annular frame F, whereby these members are united.

Figure 2:
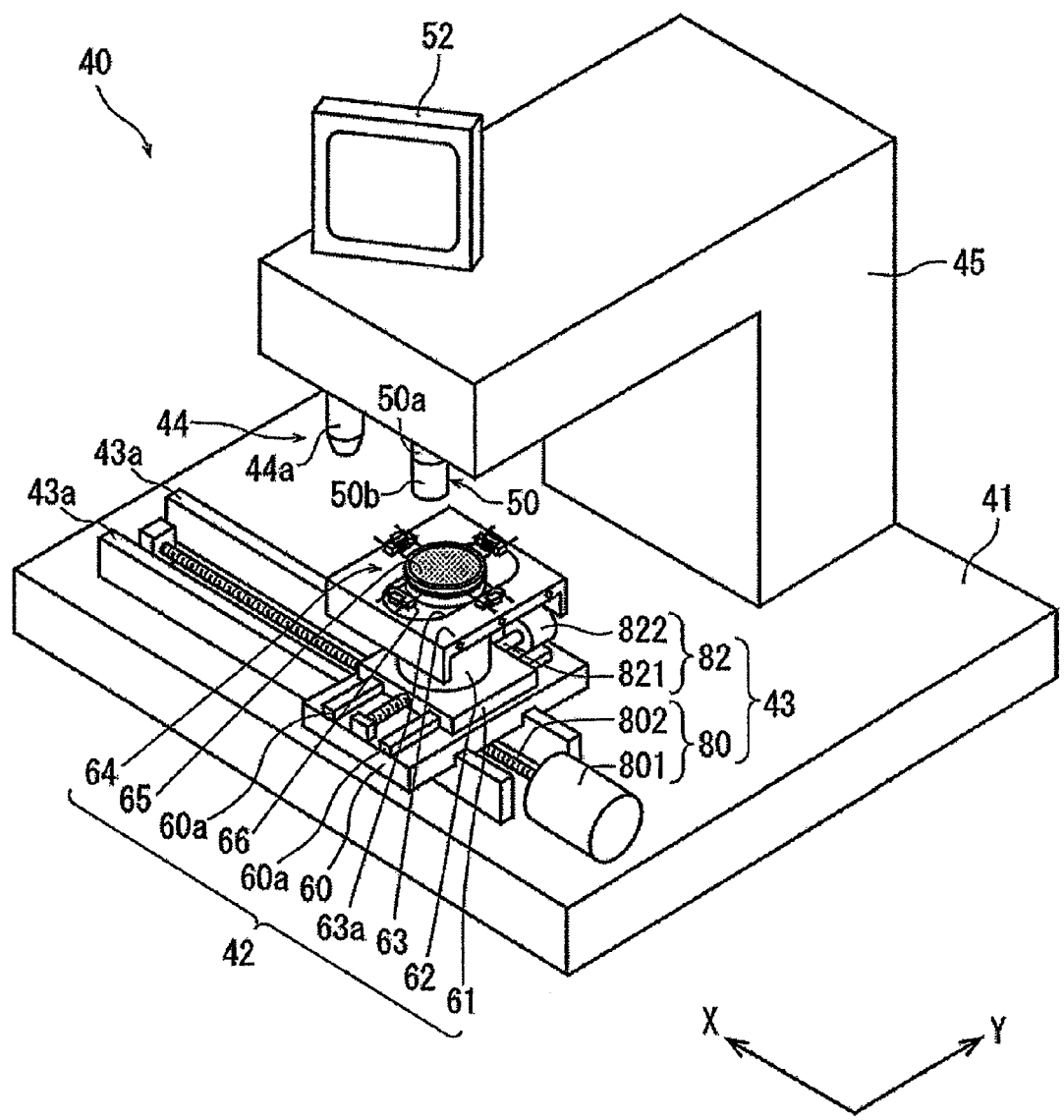
FIG. 2 is an overall perspective view of a laser processing apparatus configured.

FIG. 2 shows an overall perspective view of a laser processing apparatus 40 for carrying out laser processing according to the wafer processing method of the present invention. The laser processing apparatus 40 depicted in FIG. 2 includes a base 41, a holding mechanism 42 for holding the wafer 10, moving means 43 for moving the holding mechanism 42, laser beam applying means 44 for applying a laser beam to the wafer 10 held by the holding mechanism 42, imaging means (imaging unit) 50, display means 52, and control means (not shown) composed of a computer, wherein these component members or means are controlled by the control means.

The holding mechanism 42 includes: a rectangular X-direction movable plate 60 mounted on the base 41 such as to be movable in an X-direction; a rectangular Y-direction movable plate 61 mounted on the X-direction movable plate 60 such as to be movable in a Y-direction; a cylindrical column 62 fixed on an upper surface of the Y-direction movable plate 61; and a rectangular cover plate 63 fixed to an upper end of the column 62. The cover plate 63 is formed with a slot 63a extending in the Y-direction. A circular chuck table 64 as holding means for holding the workpiece extends upward through the slot 63a, and a circular suction chuck 65 formed from a porous material and extending substantially horizontally is disposed on an upper surface of the chuck table 64. The suction chuck 65 is connected to suction means (not shown) through a passage extending through the column 62. At the periphery of the chuck table 64, a plurality of clamps 66 are disposed at intervals along the circumferential direction. Note that the X-direction is a direction indicated by arrow X in FIG. 2, and the Y-direction is a direction indicated by arrow Y in FIG. 2 and orthogonal to the X-direction. A plane defined by the X-direction and the Y-direction is substantially horizontal.

The moving means 43 includes X-direction moving means 80, Y-direction moving means 82, and rotating means (not shown). The X-direction moving means 80 includes a ball screw 802 extending in the X-direction over the base 41, and a motor 801 connected to one end portion of the ball screw 802. A nut portion (not shown) of the ball screw 802 is fixed to a lower surface of the X-direction movable plate 60. In operation of the X-direction moving means 80, a rotational motion of the motor 801 is converted by the ball screw 802 into a rectilinear motion, which is transmitted to the X-direction movable plate 60, whereby the X-direction movable plate 60 is advanced or retracted in the X-direction along guide rails 43a on the base 41. The Y-direction moving means 82 includes a ball screw 821 extending in the Y-direction over the X-direction movable plate 60, and a motor 822 connected to one end portion of the ball screw 821. A nut portion (not shown) of the ball screw 821 is fixed to a lower surface of the Y-direction movable plate 61. In operation of the Y-direction moving means 82, a rotational motion of the motor 822 is converted by the ball screw 821 into a rectilinear motion, which is transmitted to the Y-direction movable plate 61, whereby the Y-direction movable plate 61 is advanced or retracted in the Y-direction along guide rails 60a on the X-direction movable plate 60. The rotating means is incorporated in the column 62, and rotates the suction chuck 65 relative to the column 62.

The laser beam applying means 44 includes: a pulsed laser beam oscillator which is incorporated in a frame body 45 extending upward from the upper surface of the base 41 and then extending substantially horizontally and which oscillates a laser beam having a wavelength of, for example, 1,030 nm and being transmittable through the wafer 10 to be processed; output control means for controlling the output of the laser beam applied from the pulsed laser beam oscillator; and a reflective mirror by which the optical path of the laser beam controlled in output by the output control means is converted toward focusing means 44a disposed on a lower surface of a tip of the frame body 45 in the manner of being aligned with the imaging means 50 (described later) in the X-direction.

The imaging means 50 is attached to the lower surface of the tip of the frame body 45, and is located over the guide rails 43a, such that by moving the chuck table 64 along the guide rails 43a, the wafer 10 mounted on the chuck table 64 can be imaged. In addition, the display means 52 on which an image obtained by imaging by the imaging means 50 is outputted through the control means (not shown) is mounted on an upper surface of the tip of the frame body 45.

The laser processing apparatus 40 for carrying out the wafer processing method configured based on the present invention is generally configured as above, and its operation will be described below. In applying laser processing to the wafer 10 by the laser processing apparatus 40, first, the wafer 10 is mounted on the suction chuck 65 of the laser processing apparatus 40 shown in FIG. 2, with the pressure sensitive tape T side on the lower side, and the annular frame F is fixed by the clamps 66 arranged around the chuck table 64. Then, the suction means (not shown) is operated, whereby the wafer 10 is fixed onto the suction chuck 65 by suction.

After the wafer 10 is fixed onto the suction chuck 65 by suction, the X-direction moving means 80 is operated, whereby the suction chuck 65 with the wafer 10 suction held thereon is positioned at a position beneath the imaging means 50, and a detection step is conducted in which a processing region where laser processing is to be performed, or a region corresponding to the division line 14, of the wafer 10 is detected and alignment is performed by the imaging means 50 and the control means. The detection step will be described in detail below, referring to FIGS. 3A, 3B, and 4.

Figure 3A:
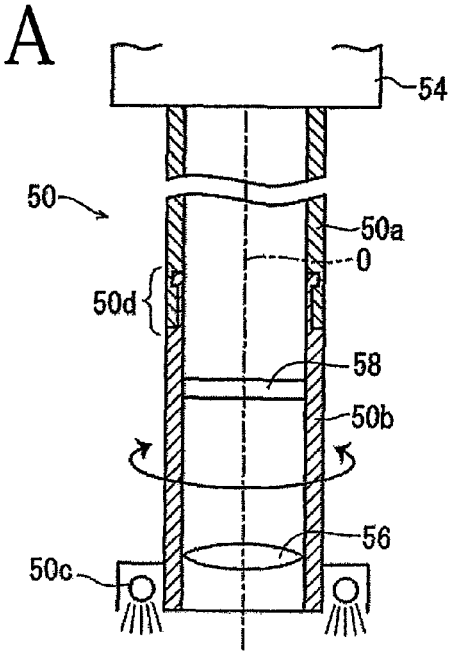
FIGS. 3A and 3B illustrate imaging means disposed in the laser processing apparatus shown in FIG. 2.

FIG. 3A shows a major part sectional view of the imaging means 50. As shown, the imaging means 50 includes an upper lens barrel 50a having an imaging element (charge-coupled device (CCD)) 54 disposed at an upper portion thereof, a lower lens barrel 50b having an image forming lens 56 disposed on a lower side therein, and a light source 50c disposed at a lower end portion of the lower lens barrel 50b and casting visible light onto a workpiece. The lower lens barrel 50b is supported in such a manner as to be rotatable about a lens barrel axis O relative to the upper lens barrel 50a, through a joint part 50d. In addition, a polarizing plate 58 as a polarizer is disposed between the imaging element 54 and the image forming lens 56. Since the polarizing plate 58 is provided on the side of the lower lens barrel 50b, when the lower lens barrel 50b is rotated relative to the upper lens barrel 50a, the polarizing plate 58 is rotated together with the lower lens barrel 50b, so that only rectilinearly polarized light having a plane of polarization coinciding with a predetermined direction defined by the polarizing plate 58 is transmitted. Note that while only the upper lens barrel 50a, the lower lens barrel 50b, the imaging element 54, the image forming lens 56, and the polarizing plate 58 are depicted in FIG. 3A, the configuration of the imaging means 50 is not limited to this configuration, and other components such as a collimator lens may be added thereto.

Figure 3B:
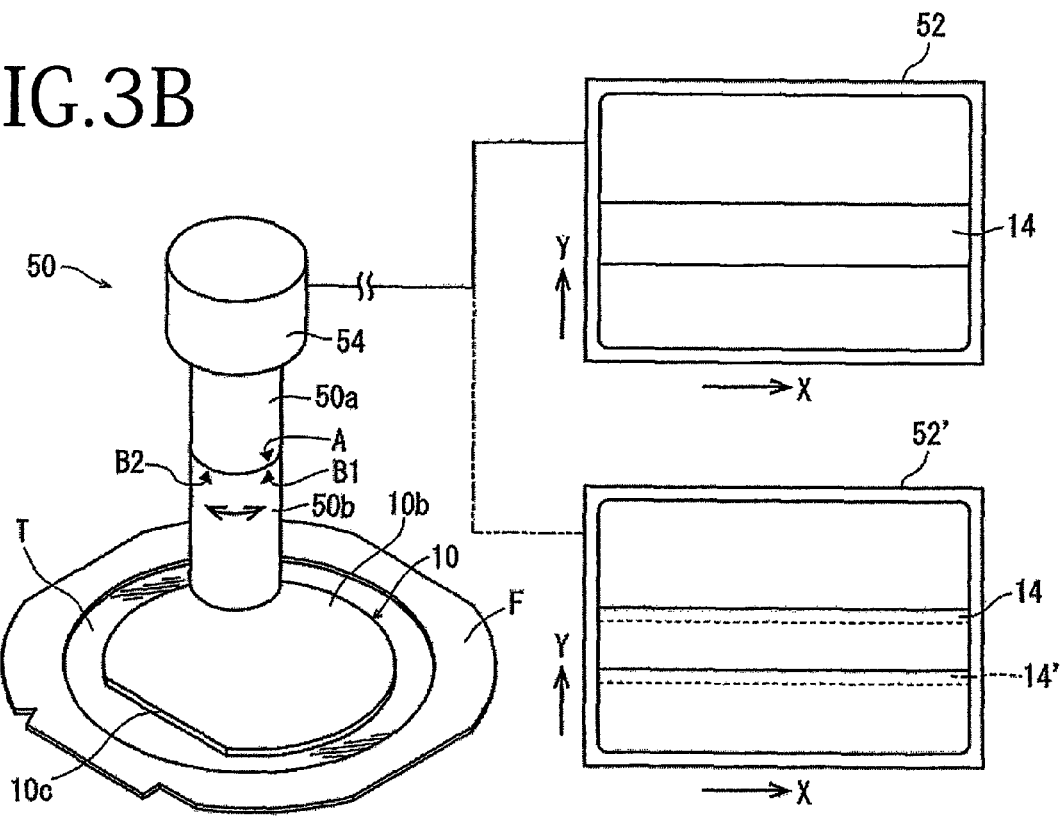

As shown in FIG. 3B, for carrying out image processing such as pattern matching for alignment between the division line 14 on the wafer 10 and the focusing means 44a of the laser beam applying means 44 for applying a laser beam along the division line 14, the imaging means 50 images the division line 14 on the wafer 10 held on the suction chuck 65, and transmits an image signal to the control means, which outputs the image signal to the display means 52. Here, in this embodiment, the polarizing plate 58 is disposed between the image forming lens 56 and the imaging element 54. Therefore, by the function of the polarizing plate 58, a virtual image is excluded and only a real image is transmitted, so that an accurate position of the division line 14 is detected by the control means, and only the real image of the division line 14 is displayed on the display means 52. Note that in the case where the wafer 10 is imaged without disposing the polarizing plate 58 between the imaging element 54 and the image forming lens 56 not like this embodiment, a division line 14 indicated by solid lines and a division line 14' displayed as a virtual image appear, as displayed on display means 52' in FIG. 3B, so that it is difficult to accurately detect the division line 14.

Here, a detection principle by which only the real image of the division line 14 can be detected in the detection step of the present invention will be described. Lithium niobate constituting the substrate of the wafer 10 selected as a workpiece in this embodiment has a trigonal crystal structure and shows birefringence. A ray transmitted through the substrate is divided into two rays, based on two refractive indexes. In this case, a ray for which a refractive index at the time of reflection does not depend on the angle of incident light relative to the optical axis is called ordinary light (ordinary ray), whereas a ray for which a refractive index at the time of reflection varies depending on the angle relative to the optical axis is called extraordinary light (extraordinary ray). If the optical axis of the material (lithium niobate) constituting the wafer 10 is perpendicular to the plane of the wafer 10, the refractive indexes for the ordinary light and the extraordinary light coincide with each other; therefore, a real image and a virtual image would not appear at the time of imaging in a perpendicular direction. However, in the case where the wafer 10 is configured as a substrate for forming SAW devices, in general, the optical axis of the substrate is inclined relative to the normal which is perpendicular to the plane of the wafer 10. Therefore, in the case where it is intended to image in a perpendicular direction, both a real image formed as ordinary light for which a refractive index does not depend on the optical axis and a virtual image formed as extraordinary light for which a refractive index varies depending on the angle relative to the optical axis appear.

Figure 4:
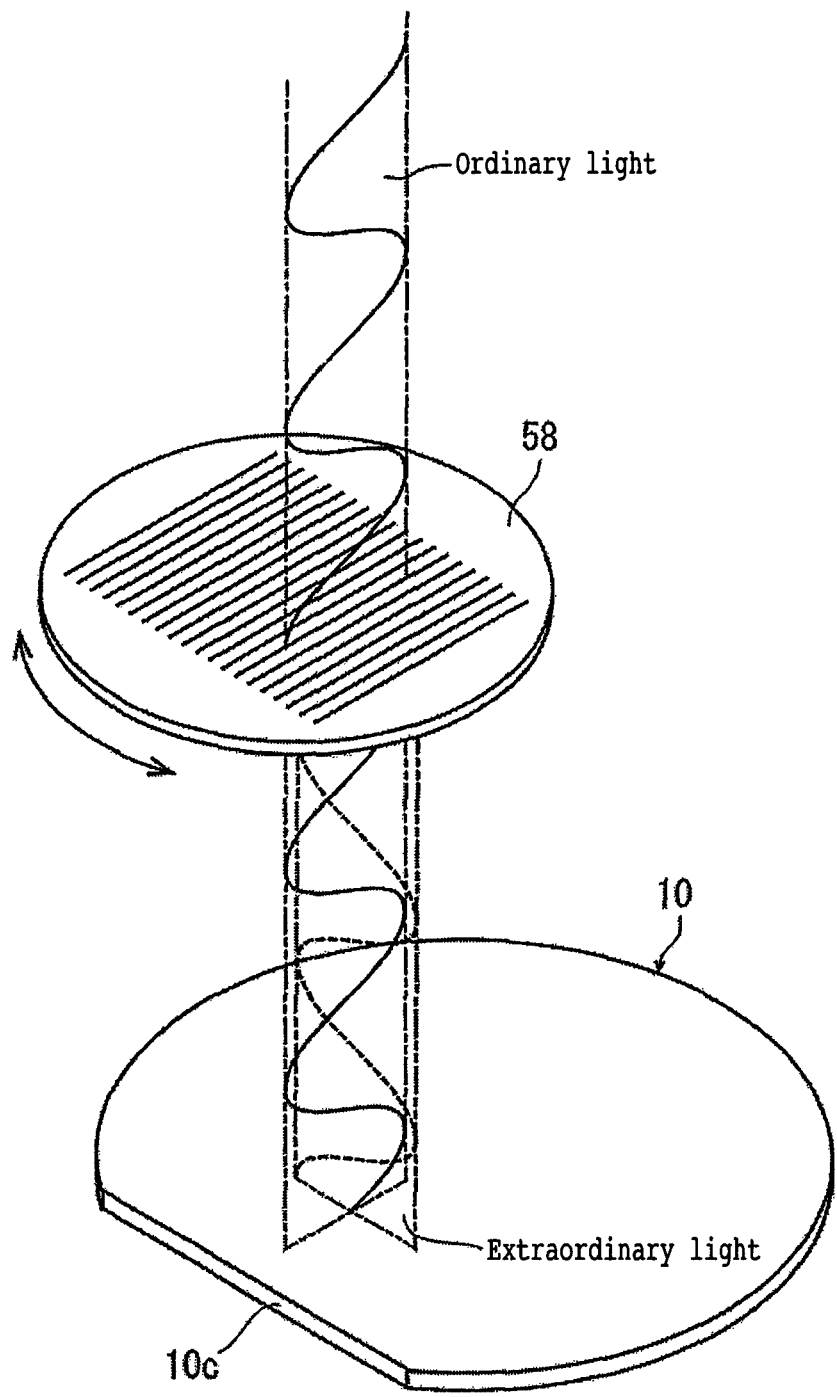
FIG. 4 is a schematic perspective view for illustrating the principle of a detection step carried out by the imaging means shown in FIGS. 3A and 3B.

The orientation flat 10c formed in the wafer 10 is formed along the inclination direction of the optical axis of the material constituting the substrate. The extraordinary light appearing as the virtual image appears as linearly polarized light having a plane of polarization in the inclination direction of the optical axis, namely, in the direction of the orientation flat 10c. In view of this, the direction of the polarizing plate 58 of the present embodiment is set in a direction orthogonal to the orientation flat 10c, as illustrated in FIG. 4. As aforementioned, the plane of polarization of the extraordinary light is formed in parallel to the orientation flat 10c. Therefore, the extraordinary light, or the virtual image, appearing due to reflection on the surface of the wafer 10 cannot pass through the polarizing plate 58 but is absorbed, and only the ordinary light having a plane of polarization orthogonal to the orientation flat 10c can pass through the polarizing plate 58, so that only a real image of the division line 14 is formed by the imaging element 54 on the upper side. Note that the imaging element 54, the upper lens barrel 50a, the lower lens barrel 50b, the image forming lens 56 and the like are omitted in FIG. 4, for convenience of explanation.

As is clear from FIG. 1, the division lines 14 are provided in a direction parallel to the orientation flat 10c and in a direction orthogonal to the orientation flat 10c. Therefore, the aforementioned detection step is carried out also in regard of the division line 14 formed in the direction orthogonal to the direction in which the orientation flat 10c of the wafer 10 is provided, so as thereby to perform alignment with the laser beam applying position. In this case, the rotating means incorporated in the column 62 of the holding mechanism 42 disposed in the laser processing apparatus 40 is driven, to rotate the wafer 10 by 90°. Attendant on this, the plane of polarization of the extraordinary light is also rotated by 90°. Therefore, in the case of performing the detection step after the wafer 10 is rotated by 90°, the lower lens barrel 50b is rotated by 90°, and the direction of the polarizing plate 58 is changed by 90°, to thereby absorb the extraordinary light. Note that marks A, B1, and B2 for angle adjustment in FIG. 3B are given to the joint part 50d between the upper lens barrel 50a and the lower lens barrel 50b. At the time of performing the detection step for detecting the division line 14 parallel to the orientation flat 10c, the mark B1 provided on the lower lens barrel 50b side is aligned to the mark A provided on the upper lens barrel 50a side. On the other hand, at the time of carrying out the detection step for detecting the division line 14 in the direction orthogonal to the orientation flat 10c, the mark B2 provided on the lower lens barrel 50b side is aligned to the mark A provided on the upper lens barrel 50a side. In this way, the polarizing plate 58 can be accurately rotated by 90°. The rotation may be carried out manually, or may be conducted by providing driving means such as a driving motor and performing drive control. With the detection step carried out as above, alignment in regard of all the division lines 14 is completed.

Figure 5:
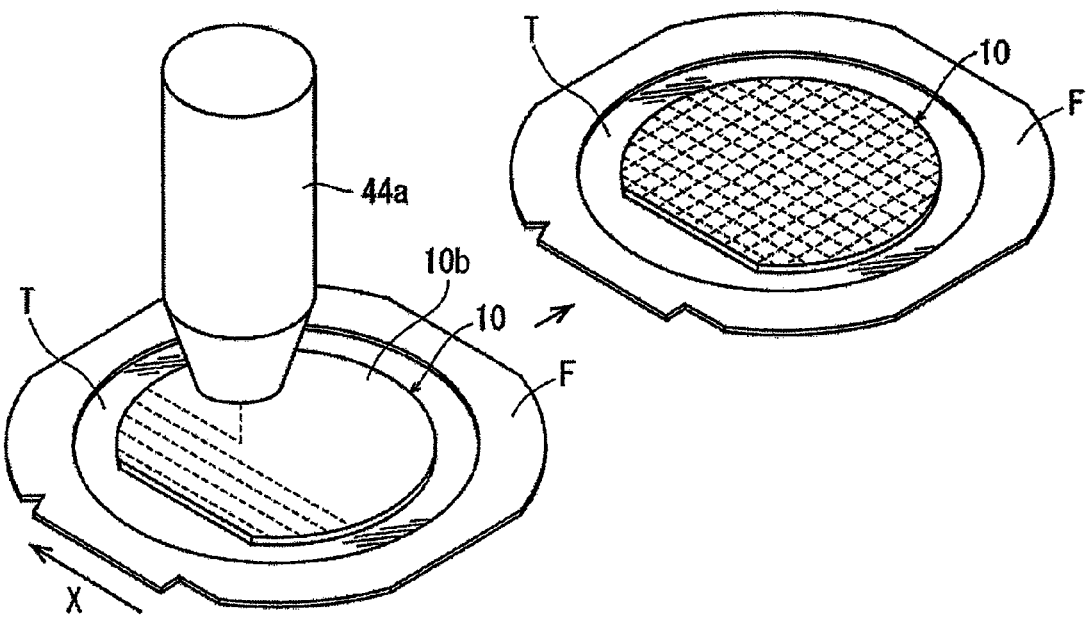
FIG. 5 is a perspective view for illustrating laser processing performed by the laser processing apparatus shown in FIG. 2.

After the above-mentioned detection step is carried out, the chuck table 64 with the wafer 10 held thereon is moved to a laser beam applying region where the focusing means 44a is located, and positioning is conducted such that one end of the division line 14 formed in a predetermined direction is located beneath the focusing means 44a. Then, focal point adjusting means (not shown) is operated to move the focusing means 44a in the optical axis direction, whereby the focal point is positioned at a predetermined position in the inside of the substrate constituting the wafer 10. After the positioning of the focal point is conducted, the laser beam applying means 44 is operated, and a pulsed laser beam for forming shield tunnels inside the wafer 10 is oscillated by the laser oscillator. When the application of the laser beam is started, the X-direction moving means 80 is operated, to move the chuck table 64 in the direction indicated by arrow X in FIG. 5, whereby the laser beam is applied along the division line 14. By this, shield tunnels each including a minute hole extending in the vertical direction and an amorphous phase for shielding the minute hole are formed in a continuous fashion along the division line 14. The laser beam applying means 44, the chuck table 64, the X-direction moving means 80, the Y-direction moving means 82, and the rotating means (not shown) are operated, to form the shield tunnels along all the crossing division lines 14 formed on the front surface 10a of the wafer 10 (see FIG. 5). By the above operations, a division starting point forming step is completed.

Processing conditions in the division starting point forming step for forming the shield tunnels are, for example, set as follows.

Figure 6:
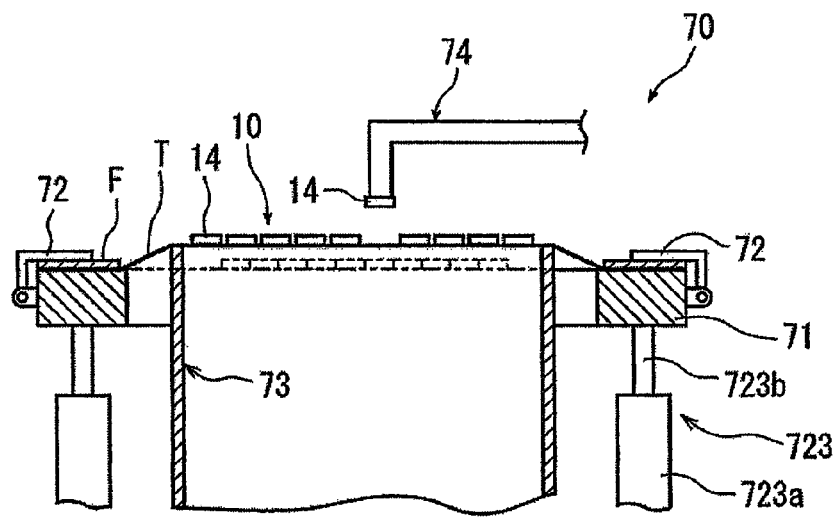
FIG. 6 is a sectional view for illustrating a division step performed based on the present invention.

Wavelength: 1,030 nm
Average output: 3 W
Repetition frequency: 50 kHz
Pulse width: 10 ps
Spot diameter: 1 μm
Numerical aperture of focusing lens/Refractive index of wafer: 0.05 to 0.20
X-direction processing feed speed: 500 mm/second
Shield tunnel size: 1 μm minute hole, 10 μm amorphous phase After the division starting point forming step is conducted, a division step of dividing the wafer 10 into individual devices 12 is carried out. The division step is carried out by a dividing apparatus 70, part of which is depicted in FIG. 6. The dividing apparatus 70 includes a frame holding member 71, clamps 72 for holding the annular frame F placed on an upper surface portion of the frame holding member 71, and an expansion drum 73 for expanding the wafer 10 mounted to the annular frame F held by the clamps 72, the expansion drum 73 having a hollow cylindrical shape opening at least on the upper side. The frame holding member 71 is liftably supported by support means 723 that includes a plurality of air cylinders 723a disposed in such a manner as to surround the expansion drum 73, and piston rods 723b extending from the air cylinders 723a.

The expansion drum 73 is set to be smaller than the inside diameter of the annular frame F and greater than the outside diameter of the wafer 10 adhered to the pressure sensitive adhesive tape T mounted to the frame F. Here, as shown in FIG. 6, the dividing apparatus 70 can be put into a position at which the frame holding member 71 and the upper surface portion of the expansion drum 73 are at substantially the same height (this position is indicated by broken lines), and a position at which the frame holding member 71 has been lowered by the function of the support means 723 and the upper end portion of the expansion drum 73 is higher than the upper end portion of the frame holding member 71 (this position is indicated by solid lines).

When the frame holding member 71 is lowered so that the upper end of the expansion drum 73 is relatively changed from the position indicated by broken lines to the position higher than the frame holding member 71 as indicated by solid lines, the pressure sensitive tape T mounted to the annular frame F is pressed against an upper end edge of the expansion drum 73 and expanded. As a result, radial tensile forces are exerted on the wafer 10 adhered to the pressure sensitive adhesive tape T, so that the spacing between the individual SAW devices 12 of the wafer 10, which has been formed therein with the shield tunnels along the division lines 14 in the aforementioned division starting point forming step, is widened. Then, in the state wherein the spacing between the individual SAW devices 12 has been widened, a pick-up collet 74 is operated to suck the SAW device 12 in the wide-spaced state, to pick up the SAW device 12 by releasing it from the pressure sensitive adhesive tape T, and to transport the SAW device 12 to a tray (not shown) or a processing apparatus (not shown) for a subsequent step.

By the above operations, the division step is finished, whereby the wafer processing method according to the present invention is completed. Note that the division step in which external forces are exerted is not limited to the mode of being carried out by the above-mentioned means; thus, the above-mentioned means may be replaced by another means, or other means may be further added to the above-mentioned means. For example, the wafer 10 may be divided along the division lines 14 by a method in which in the aforementioned division step, resin-made rollers positioned to be parallel to the division lines 14 are pressed against the wafer 10 held on the pressure sensitive adhesive tape T, from the upper side of the wafer 10, and rolled on the surface of the wafer 10 to exert downward forces on the wafer 10.

Figure 7:
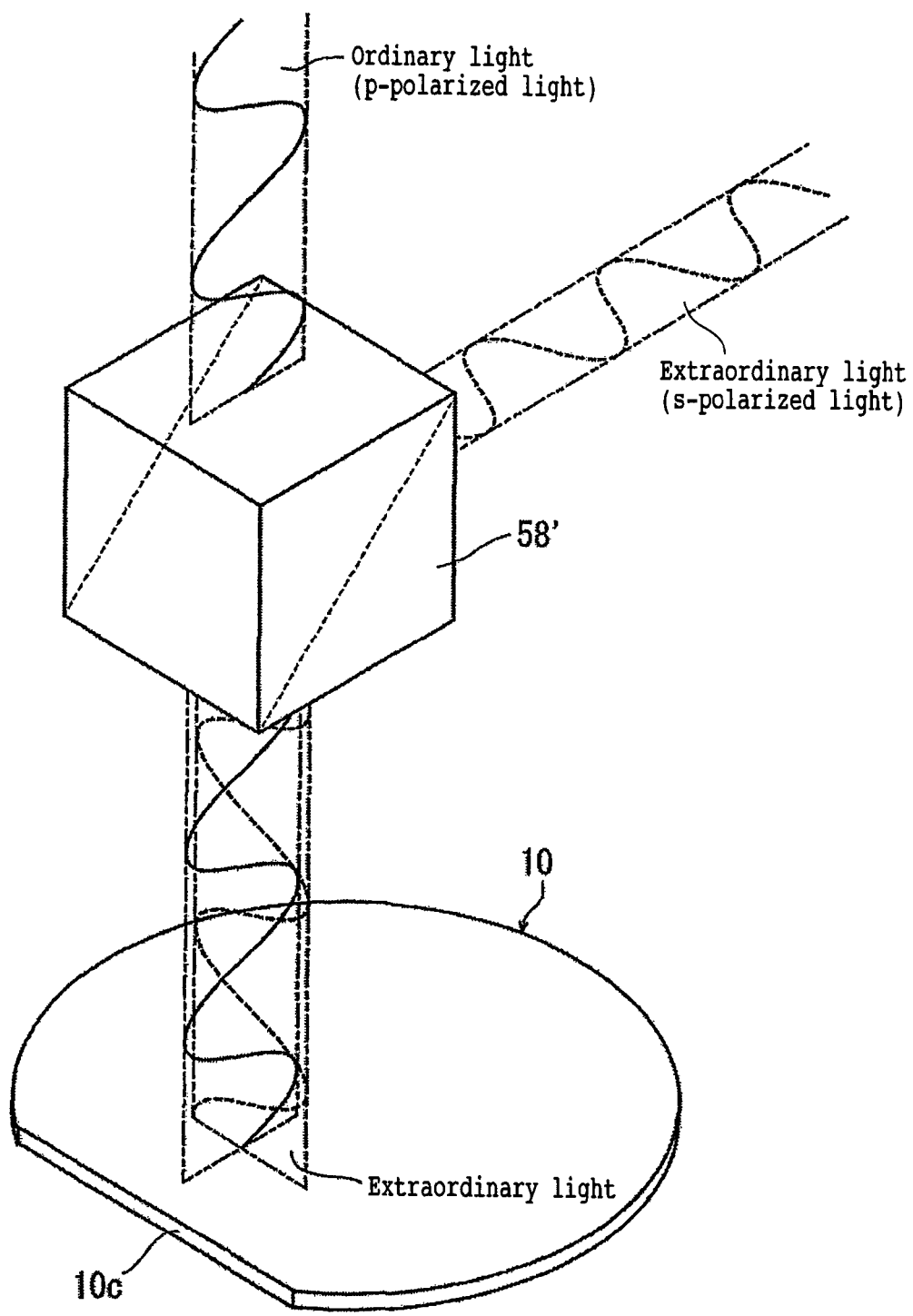
FIG. 7 is a schematic perspective view for illustrating another embodiment of the imaging means shown in FIGS. 3A and 3B.

The present invention is not limited to this embodiment, and various modifications can be adopted. While the polarizing plate 58 has been adopted as the polarizer in this embodiment, a polarization beam splitter 58' may be adopted in place of the polarizing plate 58, as shown in FIG. 7. As the polarization beam splitter 58', one obtained by adhering two rectangular prisms to each other can be adopted. In this case, either one of interfaces (mating surfaces) of the rectangular prisms is provided thereon with a dielectric multilayer film coat, whereby incident light is split into ordinary light (p-polarized light) vibrating in an incidence plane orthogonal to the interface and extraordinary light (s-polarized light) vibrating in a direction orthogonal to the incidence plane. Like in the case of the aforementioned polarizing plate 58, only the ordinary light is transmitted to the side of the imaging element 54 located on the upper side, and the extraordinary light is separated and radiated to a beam dump (not shown) that absorbs the laser beam. Note that as the polarization beam splitter, a plate-type one including a flat glass plate can also be selected. In that case, however, the optical path of the ordinary light transmitted through the plate is slightly shifted depending on the thickness of the plate, and, therefore, image correction is needed. For this reason, it is preferable to select the polarization beam splitter obtained by adhering rectangular prisms to each other as illustrated in FIG. 7. Furthermore, like the polarizing plate 58, the polarization beam splitter 58' is also appropriately rotated in accordance with the rotation of the wafer 10 in the detection step, whereby only the real image of all the division lines 14 can be imaged.

In addition, while an example wherein laser processing for forming the shield tunnels as the division starting points formed along the division lines 14 is performed has been described in the division starting point forming step in the above embodiment, the present invention is not limited to this example. The present invention is applicable to any laser processing that needs detection of division lines from the back side of a wafer including a substrate formed of a birefringent material. For example, in application of the present invention, the technology for forming modified layers in the inside of a wafer 10 as described in Japanese Patent No. 3408805 may also be adopted. In that case, laser processing conditions are, for example, set as follows.

Wavelength: 1,340 nm
Average output: 1 W
Repetition frequency: 50 kHz
Pulse width: 1 ns
Spot diameter: 1 μm
Numerical aperture: 0.8
X-direction processing feed speed: 100 mm/second While an example wherein lithium niobate is used as the material of the substrate constituting the wafer 10 as a workpiece has been described in this embodiment, the present invention is not limited to this. The present invention is applicable also to cases where substrates of other birefringent materials are used.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer having a plurality of devices formed in regions partitioned by a plurality of crossing division lines on a front surface of a substrate having a birefringent crystal structure, into individual device chips, the wafer processing method comprising:
   a detection step of detecting the division line formed on the front surface of the wafer by imaging means from a back side of the wafer;
   a division starting point forming step of applying a laser beam from the back side corresponding to the detected division line to form division starting points; and
   a division step of applying an external force to the wafer to divide the wafer into the individual device chips,
   wherein, in the detection step, a polarizer disposed on an optical axis connecting an imaging element and an image forming lens provided in the imaging means intercepts extraordinary light appearing due to birefringence in the substrate and guides ordinary light to the imaging element.

2. The wafer processing method according to claim 1, wherein the polarizer includes a polarizing plate or a polarization beam splitter.

3. The wafer processing method according to claim 1, wherein the substrate is formed of lithium niobate ($LiNbO_3$), and the devices are surface acoustic wave devices.

4. The wafer processing method according to claim 3, wherein linearly polarized light having a plane of polarization orthogonal to an orientation flat indicative of a crystal orientation formed on the wafer is the ordinary light.

* * * * *